United States Patent [19]

Misumi

[11] Patent Number: 4,707,210
[45] Date of Patent: Nov. 17, 1987

[54] PLASMA CVD APPARATUS

[75] Inventor: Teruo Misumi, Kawasaki, Japan

[73] Assignee: Canon Kabushiki Kaisha, Tokyo, Japan

[21] Appl. No.: 858,083

[22] Filed: Apr. 28, 1986

Related U.S. Application Data

[63] Continuation of Ser. No. 628,853, Jul. 9, 1984, abandoned.

[30] Foreign Application Priority Data

Jul. 15, 1983 [JP] Japan .................................. 58-129082

[51] Int. Cl.⁴ .............................................. C23C 2/32
[52] U.S. Cl. ..................................... 156/345; 118/730; 118/725
[58] Field of Search ....................... 264/22, 81; 427/38, 427/39; 156/345, 643; 118/730, 725

[56] References Cited

U.S. PATENT DOCUMENTS

| | | | |
|---|---|---|---|
| 4,149,923 | 4/1979 | Uehara et al. | 156/345 |
| 4,226,208 | 10/1980 | Nishida et al. | 118/725 |
| 4,230,515 | 10/1980 | Zajac | 156/345 |
| 4,380,489 | 4/1983 | Beinvogl et al. | 156/345 X |
| 4,392,452 | 7/1983 | Taketoshi et al. | 118/725 |
| 4,466,380 | 8/1984 | Jansen et al. | 118/730 |
| 4,483,737 | 11/1984 | Mantei | 156/643 |
| 4,526,644 | 7/1985 | Fujiyama et al. | 156/345 |

Primary Examiner—Tim Miles
Attorney, Agent, or Firm—Fitzpatrick, Cella, Harper & Scinto

[57] ABSTRACT

A plasma chemical vapor deposition apparatus comprises internal construction members comprising aluminum having surfaces exposed to a plasma atmosphere.

1 Claim, 1 Drawing Figure

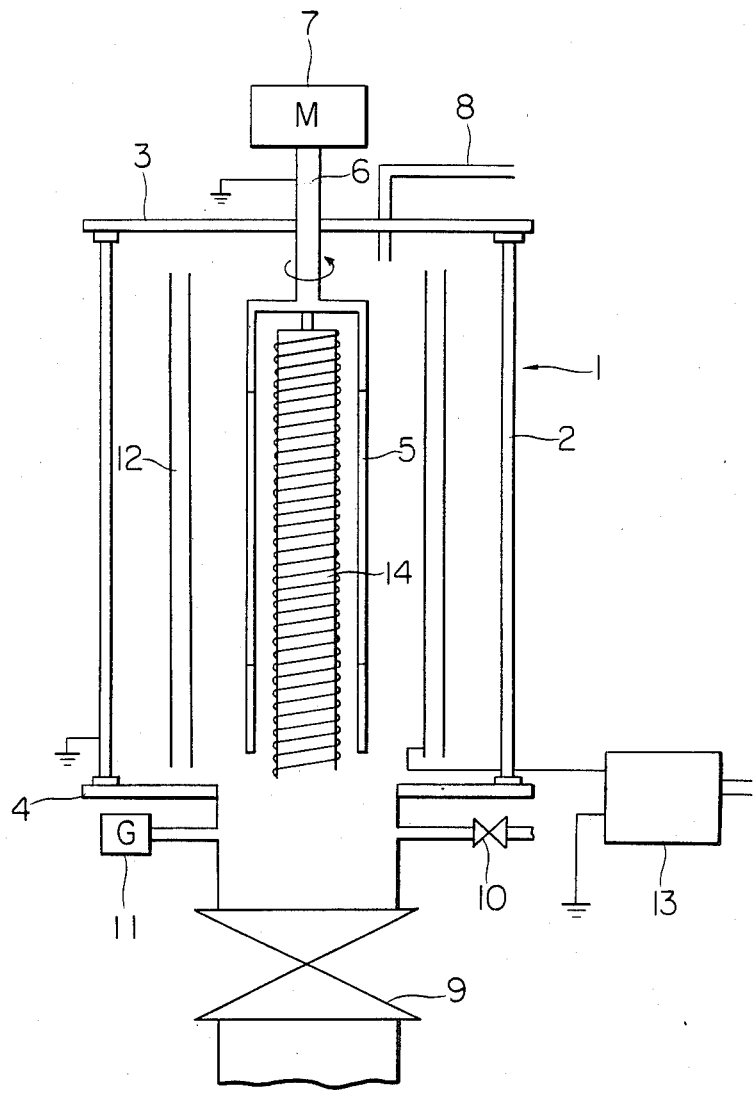

PLASMA CVD APPARATUS

This application is a continuation of application Ser. No. 628,853, filed July 9, 1984, now abandoned.

BACKGROUND OF THE INVENTION

1. Field of the Invention

This invention relates to a plasma, chemical vapor deposition (CVD) apparatus which may be used for various treatments such as etching a substrate to be treated, forming a vapor-deposited or deposited film, removing residual matters of a vapor-deposited or deposited film and the like in plasma atmospheres of fluorine compound gases formed in a vacuum chamber, and more particularly, to a plasma CVD apparatus suitable for forming deposited films of silicon or silicon compounds.

2. Description of the Prior Art

As a construction material for vacuum chambers, a material which surface is chemically and thermally stable and which releases gases as little as possible is desired. This is also the case for plasma CVD apparatuses, and stainless steels are used for the vacuum chambers and internal jigs such as high frequency electrode and the like. However, when the plasma CVD apparatuses comprising stainless steels are used for manufacturing semiconductor circuits using fluorine compound gases such as $CF_4$ and the like to etch silicon wafers, or removing residual matters of deposited films, the surface of the stainless steel construction members exposed to the plasma atmosphere is corroded with fluorine radicals formed in the plasma resulting in the formation of milky white powder-like iron trifluoride ($FeF_3$) on the surface. The $FeF_3$ is formed by the chemical reaction of fluorine radicals with iron as a main component of stainless steel on the surface of the stainless steel. As a result, the stainless steel construction members are deteriorated and the reaction chamber is contaminated with fluorine.

In addition, the $FeF_3$ formed on the surface of the stainless steel construction members are so fragile that the $FeF_3$ is peeled off from the surface and suspended in the reaction chamber, and therefore, after the etching, pinholes are disadvantageously formed in the resulting deposited film. In order to solve the above-mentioned problems, it is necessary to select a material which is not easily corroded with fluorine radicals and the like. Examples of such material are nickel, chromium, gold, silver and the like, but these are so expensive and the mechanical strength is so weak that these materials are applied to the surface of stainless steel or iron by vapor deposition or the like. However, even if such metal film is formed on the surface of stainless steel or iron, the metal film is sometimes mechanically peeled off, or when the plasma discharging power of the fluorine compound gas is increased so as to produce a sufficient etching speed, the metal film is sputtered resulting in exposing the foundation material to the plasma atmosphere again, and corrosion starts at the exposed portion resulting in easy exfoliation of the metal film.

SUMMARY OF THE INVENTION

An object of the present invention is to solve problems of plasma CVD apparatuses in the prior art above.

Another object of the present invention is to provide a plasma CVD apparatus having high resistance in plasma atmosphere of fluorine compounds.

According to the present invention, there is provided a plasma CVD apparatus which comprises internal construction members comprising aluminum having surfaces exposed to a plasma atmosphere.

BRIEF DESCRIPTION OF THE DRAWING

The drawing shows schematically a plasma CVD apparatus according to the present invention.

DESCRIPTION OF THE PREFERRED EMBODIMENTS

Referring now to the drawing, the present invention will be described in detail below.

The drawing shows an example of the plasma CVD apparatus. In the drawing, 1 shows the vacuum chamber, and vacuum chamber 1 comprises side wall 2, top wall 3 and bottom wall 4. Numeral 5 denotes a cylindrical substrate which is subjected to etching, formation of the deposition film, removal of remains of the deposition film and the like, 6 a rotation shaft supporting and rotating the substrate, 7 a motor rotating the rotation shaft, 8 denotes a gas-introducing pipe introducing process gas into the vacuum chamber, 9 a main valve for exhaust, 10 a leak valve, 11 a vacuum meter for measuring the degree of vacuum in the inside vacuum chamber, 12 high frequency-introducing electrode for producing plasma, 13 denotes a high frequency power source, 14 a heater for heating substrate to be treated.

Function of the apparatus above will be described in brief. First, the main valve 9 is opened and the inside of vacuum chamber 1 is exhausted. Then, into the vacuum chamber is introduced a process gas through the introduction pipe. High frequency is applied to an electrode 12 by using the high frequency power source 13 to form a plasma atmosphere of gas in the inside of vacuum chamber 1. Substrate 5 to be treated is heated with a heater 14 to a predetermined temperature, and substrate 5 is processed by the plasma atmosphere.

Heretofore, stainless steel has been used usually for the parts exposed to plasma atmosphere in a vacuum chamber i.e. the walls 2, 3 and 4 of vacuum chamber 1, rotation shaft 6, electrode 12 and the like.

However, in the use of the etching effect by plasma discharge of fluorine compounds as mentioned above, as in the past, conventionally used materials containing a lot of iron such as stainless steel cause dust in the vacuum and are not desirable in forming a film since iron reacts readily with fluorine radical and the like to form powder-like products.

In such a plasma CVD apparatus, according to the present invention, parts exposed to the plasma atmosphere of a fluorine compound gas in the vacuum chamber i.e. walls 2, 3 and 4 of vacuum chamber 1, rotation shaft 6, electric source 12 and the like are formed with aluminum. Aluminum does not corrode easily in a plasma atmosphere of a fluorine compound and is of low cost compared with the above-mentioned nickel, chrome, gold and silver also aluminum is very excellent in mechanical strength and workability.

As explained above, according to the plasma CVD apparatus of the present invention, when a substrate which is subjected to various processes such as etching, forming a vacuum evaporation film removal of remains of vacuum evaporation film and the likes employing a plasma atmosphere of a fluorine compound gas, problems of corrosion of construction members do not occur, and the apparatus is highly durable and of low cost.

The plasma CVD apparatus according to the present invention is suitable for fabricating silicon photosensitive members for electrophotography. Therefore, the following example and comparative examples refer to such silicon photosensitive members to explain the advantage of the present invention.

EXAMPLE

Construction materials for wall members 2, 3 and 4 of vacuum chamber 1, rotation shaft 6, electrode 12 and the like were made of aluminum of a purity of 99.9% or more. Vacuum chamber 1 was evacuated to $10^{-2}$–$10$ Torr and a mixture of CFhd 4 gas and oxygen gas was introduced into the vacuum chamber and further, high frequency wave was introduced to electrode 12 by using a high frequency source 13 of 13.56 MHz to produce plasma by a discharging power of 1 W/cm$^2$.

The fluorine radical particles produced by a plasma reaction of the gas mixture of $CF_4$ and oxygen tetrafluoride ($SiF_4$) gas and other gases were discharged from the plasma chamber by means of a mechanical booster pump and a rotary pump. Thus the etching processing was carried out. After the etching processing, it was observed that the surface of the construction material had changed to whitish, but there was not found any powder-like product which became dust.

When the discharging power was changed in the range of 0.18 W/cm$^2$–1.8 W/cm$^2$, no powder-like product was observed on the surface even at 1.8 W/cm$^2$, and therefore, dust was not formed.

COMPARATIVE EXAMPLE 1

In a vapor deposition apparatus where a vacuum chamber 1 and internal jigs such as a high frequency electrode 12 and the like are made of stainless steel such as SUS 304 steel, SUS 316 steel and the like, etching processing was effected under the same conditions as in the Example above.

The surfaces of the construction members (2, 3, 4, 6 and 12) made of the stainless steel exposed to the plasma atmosphere were reacted with fluorine radical particles generated in the plasma, and there were formed white powder layer of $FeF_3$ of about 100 Å thick. Thus vacuum chamber 1 was contaminated with fluorine and dust was formed.

COMPARATIVE EXAMPLE 2

Stainless steel construction members (2, 3, 4, 6 and 12) as in Comparative Example 1 were plated with nickel in the thickness of 5 microns. Plasma etching was carried out under the same conditions as in Comparative Example 1 changing the plasma discharging power for ($CF_4+O_2$) gas from 0.18 W/cm$^2$ to 1.8 W/cm$^2$, and the formation of $FeF_3$ was observed. When the discharging power was 0.9 W/cm$^2$ or higher, $FeF_3$ was partly formed. As the above procedure was repeated, portions where $FeF_3$ formed increased and thus it was observed that the corrosion proceeded. In particular, the corrosion proceeded rapidly at side wall 2 and electrode 12 where discharging power was strong.

I claim:

1. A plasma CVD apparatus comprising a vacuum chamber for forming and for etching a deposition film containing silicon on a cylindrical substrate to be treated, a gas introducing means for introducing a fluorine compound gas and a gas for forming a deposition film into the vacuum chamber, a gas discharging means for discharging the gases in the vacuum chamber, a leaking means for returning pressure in the vacuum chamber to atmospheric pressure, a high frequency-introducing means for introducing to the vacuum chamber high frequency energy for generating a plasma atmosphere of the fluorine compound gas for etching and for generating a plasma atmosphere of the gas for forming the deposition film, a high frequency power source for supplying the high frequency energy to the high frequency introducing means, a supporting means for supporting the cylindrical substrate to be treated, and a heating means for heating from the inside the cylindrical substrate to be treated, wherein the surface of the walls of the vacuum chamber and the high frequency-introducing means to be exposed to the plasma atmospheres are aluminum.

* * * * *